United States Patent [19]

Egitto et al.

[11] Patent Number: 5,194,713
[45] Date of Patent: Mar. 16, 1993

[54] REMOVAL OF EXCIMER LASER DEBRIS USING CARBON DIOXIDE LASER

[75] Inventors: Frank D. Egitto; Cynthia J. Moring, both of Binghamton; Daniel C. Van Hart, Conklin, all of N.Y.

[73] Assignee: International Business Machines Corporation, Armonk, N.Y.

[21] Appl. No.: 777,057

[22] Filed: Oct. 17, 1991

[51] Int. Cl.$^5$ ............................................. B23K 26/00
[52] U.S. Cl. .......................... 219/121.71; 219/121.76
[58] Field of Search ........... 219/121.7, 121.71, 121.68, 219/121.69

[56] References Cited

U.S. PATENT DOCUMENTS 4,081,655 3/1978 Gale ........................... 219/121.69 X
5,108,562 4/1992 Duke et al. ....................... 204/129.65

Primary Examiner—C. L. Albritton
Attorney, Agent, or Firm—Richard M. Goldman

[57] ABSTRACT

Disclosed is a method of fabricating a microelectronic circuit package. The circuit package has a reinforced fluorocarbon polymer dielectric. According to the disclosed process, vias or through holes are formed in the composite by a process that leaves debris. The debris in the formed vias or through holes is reflowed in order to smooth the via and through hole walls for subsequent plating.

2 Claims, 3 Drawing Sheets

REMOVAL OF EXCIMER LASER DEBRIS USING CARBON DIOXIDE LASER

FIELD OF THE INVENTION

The invention relates to the removal of debris generated during excimer laser drilling of PTFE-glass matrices. In advanced technology chip carriers the surface circuitization is characterized by high circuitization density, narrow circuit leads at close pitches, and closely spaced, small diameter vias and through holes. These narrow diameter vias and through holes are preferably drilled by gas lasers, for example, excimer lasers. Excimer lasers leave debris within and around the vias and through holes. The debris, glass and PTFE, is not removed by plasma etching. Acid etching causes deterioration of the package. According to the method of the invention, a carbon dioxide laser post-treatment is used to remove the debris generated by excimer laser drilling.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, New York (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip or module. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

Packages may be characterized by the material used as the dielectric, i.e., as ceramic packages or as polymeric packages. The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334–371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853–922, also previously incorporated herein by reference.

In the normal process for package fabrication a fibrous body, such as a non-woven mat or woven web, is impregnated with a resin. This step includes coating the fibrous body with, for example, an epoxy resin solution, evaporating the solvents associated with the resin, and partially curing the resin. The partially cured resin is called a B-stage resin. The body of fibrous material and B stage resin is called a prepreg. The prepreg, which is easily handled and stable, may be cut into sheets for subsequent processing.

Typical resins used to form the prepreg include epoxy resins, cyanate ester resins, polyimides, hydrocarbon based resins, and fluoropolymers. One such composite material is a composite of glass fibers and PTFE-type polymeric materials.

The polymeric dielectric is processed to form an adherent surface for circuitization, and to accommodate vias and through holes. Circuitization is applied after surface preparation and hole drilling.

Subsequent processing of polymeric substrates includes circuitization, that is, the formation of a Cu signal pattern or power pattern on the prepreg, or lamination of the prepreg to a power core. Circuitization may be additive or subtractive.

In the case of additive circuitization a thin film of an adhesion layer, such as a thin film of chromium, is first applied to the prepreg or polymeric dielectric. The adhesion layer may be applied by sputtering. Typically, the film of adhesion metal is from about 500 Angstroms to about 2000 Angstroms. Thicker layers of chromium result in internal streses, while thinner layers may be non-continuous.

Thereafter a "seed" layer of copper is applied atop the adhesion layer. This copper layer is from about 3000 Angstroms thick to about 25,000 Angstroms (2.5 microns) thick. It may be applied by sputtering, evaporation, electrodeposition, or electroless deposition.

Subsequently, photoresist is applied atop the copper "seed" layer, imaged, and developed to provide a pattern for circuit deposition. Copper circuitization is then plated onto the exposed copper "seed" layer to provide the circuitization pattern on the surface of the package. The remaining photoresist is then stripped, leaving a thick copper plated circuitization pattern and a thin multilayer "background" of a "seed" copper layer and a chromium adhesion layer.

The resulting circuitized prepreg is called a core. The composite printed circuit package is fabricated by interleaving cores (including signal cores, signal/signal cores, power cores, power/power cores, and signal/power cores) with additional sheets of prepreg, and surface circuitization. Holes, as vias and through holes, may be drilled in individual core structures, for example, before or after circuitization, as described above, or in partially laminated modules.

The multi-layer structure of cores and planes in a multi-layer package requires vias and through holes to accommodate vertical circuitization. Vias and through holes are formed in the polymeric dielectric to accommodate this required vertical circuitization in multilayer packages. In the formation of vias and through holes, for example, by laser ablation in glass filled polymer dielectrics, dielectric debris is deposited within and around the vias and through holes. In the case of hydrocarbon polymer dielectrics, as polyimide dielectrics, this debris can be readily removed by plasma etching.

However, both glass fibers and PTFE-type polymers are especially resistant to plasma etching processes. Moreover, the debris is highly adherent to the the via and through hole walls, so that weak fluid rinses are ineffective in removing them. Stronger fluids, as HF, that are strong enough to remove the debris can cause degradation of the polymeric dielectric material beyond the narrow bounds of the via or through hole. Thus a need exists for an efficient, effective means of removing debris generated during excimer laser drilling from vias and through holes.

OBJECTS OF THE INVENTION

It is one object of the invention to provide a method of removing debris from excimer laser drilled vias and through holes in glass fiber - fluorcarbon composites.

It is a further object of the invention to provide a method of removing debris from excimer laser drilled vias and through holes in glass fiber - fluorcarbon composites without significant damage to the dielectric composite.

It is a still further object of the invention to provide a method of removing debris from excimer laser drilled vias and through holes in glass fiber - fluorcarbon composites that does not interfere with subsequent processing of the dielectric composite.

SUMMARY OF THE INVENTION

According to the method of the invention there is provided a method of processing a glass fiber- fluorocarbon composite dielectric by drilling, including mechanical drilling and punching, and excimer laser drilling, vias and through holes in the composite. Drilling results in excimer drilling debris, for example adherent fibrils of fluorocarbon polymer. This debris is reflowed by carbon dioxide laser post-treatment. While the composite is spoken of as having a fibrous filler, it is to be understood that the filler may be particulate.

The debris may be reflowed by heating with a $CO_2$ laser. In a preferred exemplification the $CO_2$ laser is operated in the CW mode.

With proper selection of carbon dioxide laser parameters, such as laser power, scan speed, and number of scans, the debris is caused to reflow. Reflow of the fibril debris renders the vias and through holes more amenable to subsequent plating. In this way, the reflow is not only not detrimental to subsequent processing, but actually enhances subsequent processing.

THE FIGURES

The invention may be understood by the FIGURES attached hereto.

DETAILED DESCRIPTION OF THE INVENTION

Drilling of glass fiber and fluorocarbon polymer dielectric composites results in the formation of debris fibrils within and around the drilled holes. These fibrils making plating of the vias and through holes difficult. According to the method of the invention there is provided a method of processing a glass fiber- fluorocarbon composite dielectric by drilling, including mechanical drilling and punching, and excimer laser drilling, vias and through holes in the composite, with subsequent reflow of the fibril debris.

This debris is reflowed by carbon dioxide laser post-treatment. The debris may be reflowed by heating with a $CO_2$ laser. In a preferred exemplification the $CO_2$ laser is operated in the CW mode.

Figure 1:
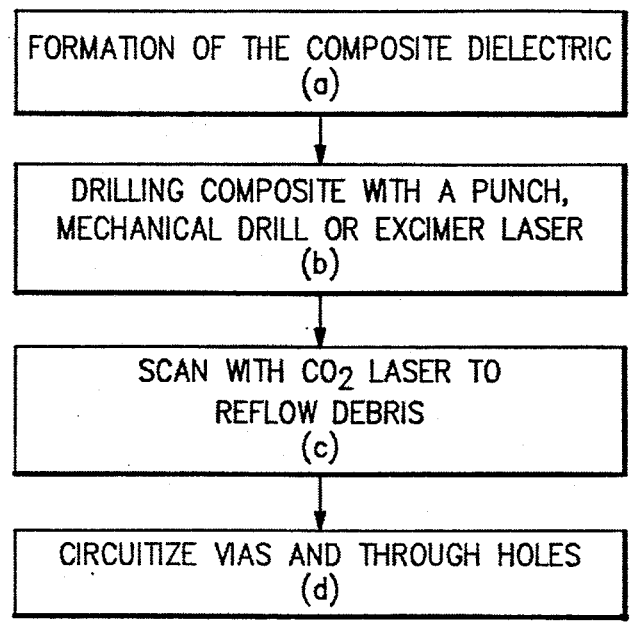
FIG. 1 is a flow chart showing the overall method of the invention.

The method of the invention is shown in the flow chart of FIG. 1. The first step is formation of the composite dielectric. This is shown in block a. The composite is then drilled, for example with a punch, a mechanical drill, or an excimer laser, as shown in block b. The resulting vias and through holes having the fibril debris described above. This debris is then reflowed by scanning with a $CO_2$ laser, as shown in block c. The composite is now ready for plating the vias and through holes, as shown in block d.

Figure 2:
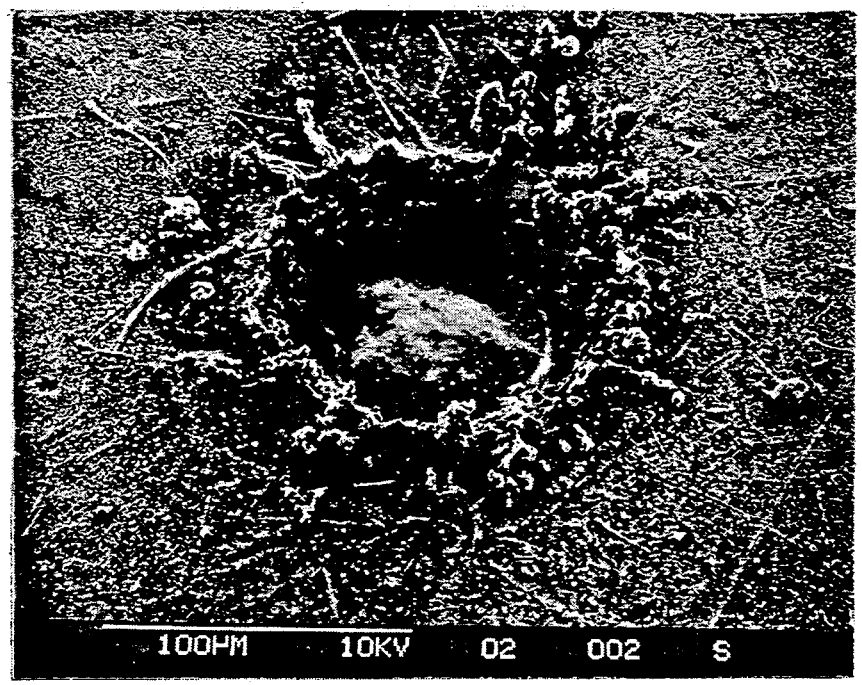
FIG. 2 is a scanning electron micrograph of an excimer laser drilled via, showing cratering and burrs, before treatment to cause reflow.
Figure 3:
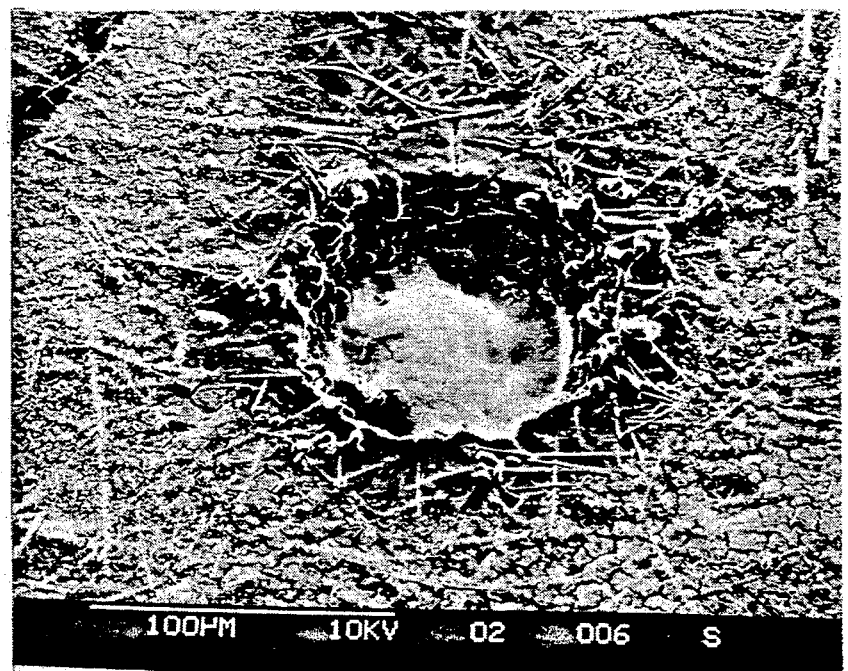
FIG. 3 shows a via after one pass with a $CO_2$ laser.
Figure 4:
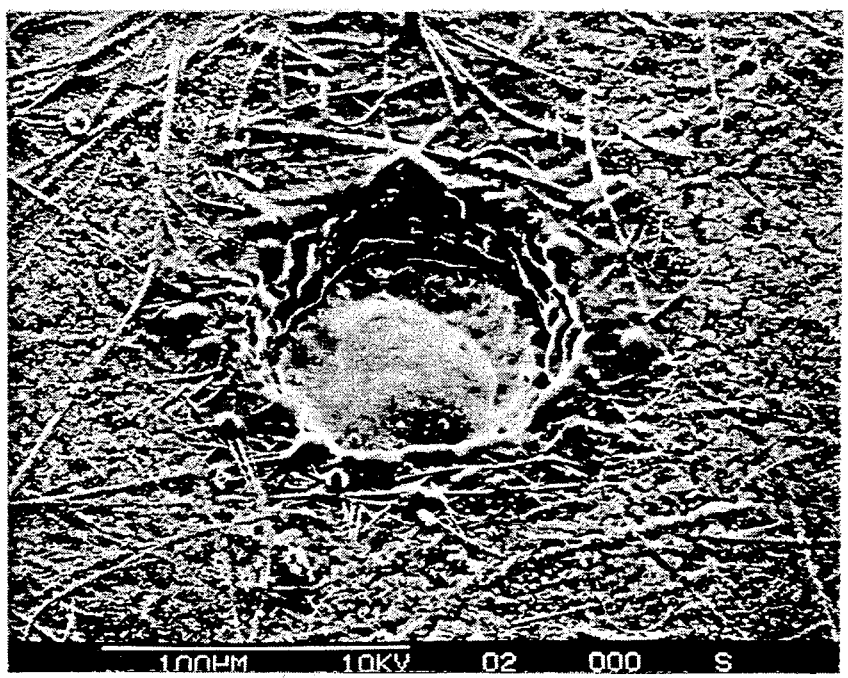
FIG. 4 shows a via after eight passes with a $CO_2$ laser.

FIG. 2 is a scanning electron micrograph of an excimer laser drilled via. A 100 micron scale is shown at the lower left hand corner of the micrograph. To be noted is the roughness of the surface and the extent of fibril debris. FIG. 3 shows a similar via after one pass with a $CO_2$ laser, and FIG. 4 shows a similar via after eight passes with a $CO_2$ laser. To be noted is the extent of reflow of the fibrils and the substantial reduction of cratering, which result in a better base for plating.

Figure 5:
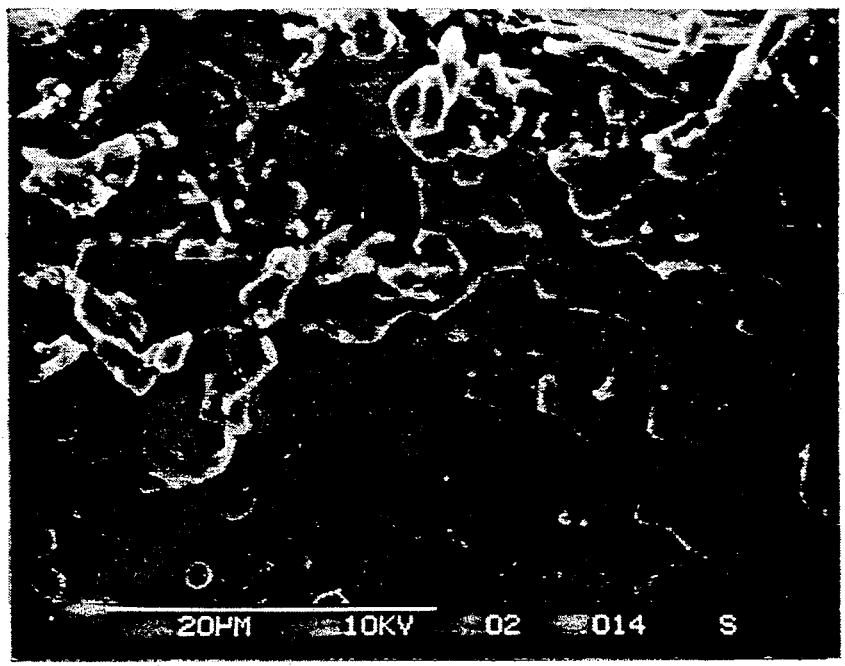
FIGS. 5 shows the sidewalls of a an excimer laser drilled via before reflow.
Figure 6:
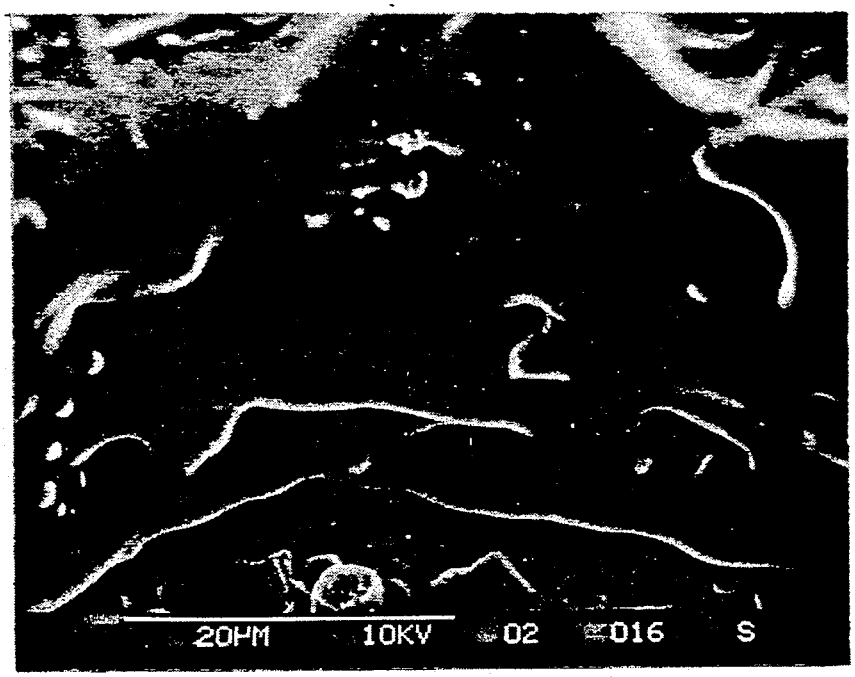
FIG. 6 shows the via sidewalls after eight passes with a $CO_2$ laser.

FIGS. 5 and 6 show the sidewalls of excimer laser drilled vias. FIG. 5 shows the sidewalls before the fibril debris has been reflowed by treatment with the $CO_2$ laser, while FIG. 6 shows the via sidewalls after eight passes with a $CO_2$ laser.

The average energy density per unit area per unit time is given by the ratio of beam power to beam spot size. With proper selection of carbon dioxide laser parameters, such as beam spot size, laser power, scan speed, and number of scans, the debris is caused to reflow. The preferred laser power is from about 1 watt to about 100 watts. Scan speed and number of scans are functions of each other and of laser power, energy density, and spot size. According to the method of the invention, at a spot size of about 0.1 $cm^2$ to about 1.0 $cm^2$, and a continuous wave (CW) laser power of 5 watts to 10 watts, particularly good results are obtained at a scan speed of about 10 centimeters second$^{-1}$ to about 20 centimeters second$^{-1}$, with about 1 to about 8 or more passes.

Reflow of the fibril debris renders the vias and through holes more amenable to subsequent plating. In this way, the reflow is not only not detrimental to subsequent processing, but actually enhances subsequent processing.

Thus, according to the method of our invention it is possible to remove debris from excimer laser drilled vias and through holes in composites where excimer laser drilling leaves debris, such as glass fiber fluorocarbon composites. This is accomplished without significant damage to the dielectric composite. Moreover, the method of the invention does not interfere with subsequent processing of the dielectric composite.

It should be noted that the method of the invention offers greater area selectivity then uniform heating of the composite. The method of the invention may be used with any reflowable debris, where the reflowed material would not be detrimental to the intended use of the composite. The method of the invention may be used to reflow the debris, or to reflow a thermoplastic material over the debris, thereby providing a smoother surface for subsequent processing.

While the invention has been described with respect to certain preferred embodiments and exemplifications, it is not intended to limit the scope of the invention thereby, but solely by the claims appended hereto.

We claim:

1. A method of fabricating a microelectronic circuit package having a glass fiber reinforced perfluorocarbon polymer dielectric, comprising the steps of:
   a. excimer laser drilling vias or through holes in the glass fiber reinforced perfluorocarbon polymer dielectric, said vias or through holes containing fibril debris;
   b. carbon dioxide laser reflowing the fibril debris in the formed vias or through holes to smooth the walls thereof; and
   c. applying an electrically conductive material to the smoothed walls.

2. A method of fabricating a microelectronic circuit package having a glass fiber reinforced perfluorocarbon polymer dielectric, comprising the steps of:
   a. mechanically drilling vias or through holes in the glass fiber reinforced perfluorocarbon polymer dielectric, said vias or through holes containing fibril debris;
   b. carbon dioxide laser reflowing the fibril debris in the formed vias or through holes to smooth the walls thereof; and
   c. applying an electrically conductive material to the smoothed walls.

* * * * *